United States Patent
Searls et al.

(10) Patent No.: US 6,614,657 B2
(45) Date of Patent: Sep. 2, 2003

(54) HEAT SINK FOR COOLING AN ELECTRONIC COMPONENT OF A COMPUTER

(75) Inventors: Damion T. Searls, Hillsboro, OR (US); Terrance J. Dishongh, Hillsboro, OR (US); James D. Jackson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/931,783

(22) Filed: Aug. 16, 2001

(65) Prior Publication Data

US 2003/0035267 A1 Feb. 20, 2003

(51) Int. Cl.$^7$ .................................................. H05K 7/20
(52) U.S. Cl. ....................... 361/704; 361/702; 361/707; 257/706; 165/80.3
(58) Field of Search .................... 361/687, 690, 361/692, 702, 704, 707, 722; 257/706–727; 165/80.2, 80.3, 80.4, 185; 174/16.3, 252

(56) References Cited

U.S. PATENT DOCUMENTS

| | | | | |
|---|---|---|---|---|
| 5,367,433 A | * | 11/1994 | Blomquist | 361/704 |
| 5,504,652 A | * | 4/1996 | Foster et al. | 361/704 |
| 6,169,657 B1 | * | 1/2001 | Choi et al. | 361/704 |
| 6,172,872 B1 | * | 1/2001 | Katsui | 361/695 |

FOREIGN PATENT DOCUMENTS

JP  411103002 A  * 4/1999  ........... H01L/23/36

* cited by examiner

Primary Examiner—Michael Datskovsky
(74) Attorney, Agent, or Firm—Blakely, Sokoloff, Taylor & Zafman LLP

(57) ABSTRACT

The heat sink is described which is used to cool an electronic component of a computer. The heat sink is constructed from a metal sheet which is bent so as to have a horizontal thermally conductive plate and four walls extending upwardly from the plate and jointly define an enclosure. Openings are formed in the walls through which air can flow by natural convection.

22 Claims, 4 Drawing Sheets

HEAT SINK FOR COOLING AN ELECTRONIC COMPONENT OF A COMPUTER

BACKGROUND OF THE INVENTION

1. Field of the Invention

This invention relates to a heat sink for an electronic component of a computer and to a computer assembly having such a heat sink.

2. Discussion of Related Art

Electronic components of computers such as processors and chipsets generate heat when being operated. To maintain functional integrity of such electronic components, it is required to maintain the temperature of these components below a predetermined maximum.

A heat sink is used for cooling such components. A heat sink has a thermal spreader which is attached or otherwise thermally connected to such an electronic component. The heat sink also has a plurality of fins extending from the thermal spreader. Heat is conducted to the thermal spreader and from the thermal spreader to the fins which provide a large surface area from which the heat can be convected to surrounding air.

Such heat sinks are usually fairly heavy and are manufactured according to fairly expensive and cumbersome extrusion processes.

BRIEF DESCRIPTION OF THE DRAWINGS

The invention is described by way of example with reference to the accompanying drawings wherein.

DETAILED DESCRIPTION OF THE INVENTION

Figure 1:
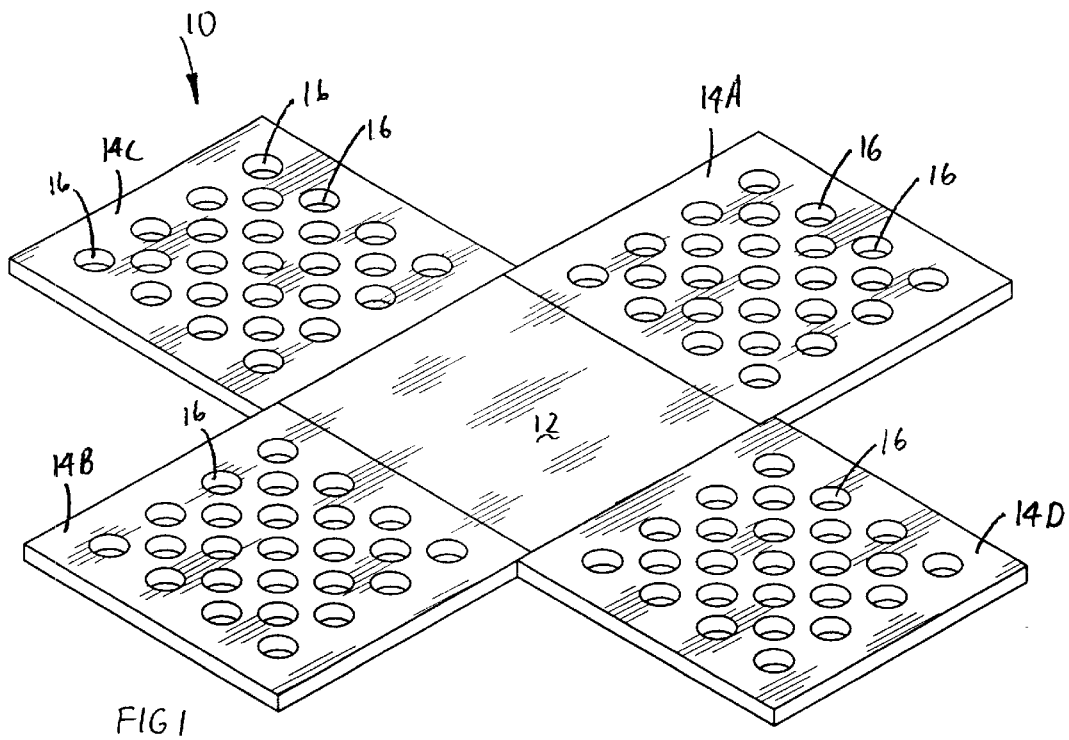
FIG. 1 is a perspective view of a metal sheet used for constructing a heat sink according to an embodiment of the invention.

FIG. 1 of the accompanying drawings illustrates a relatively light thermally conductive metal sheet 10, of a material such as aluminum or copper, which is used for constructing a heat sink according to an embodiment of the invention. The sheet 10 is shown in a horizontal orientation. The sheet 10 is stamped so as to have a central heat plate 12, and first to fourth walls 14A–D. The plate 12 is square and has four straight edges and each wall 14A–D is attached to a respective edge of the plate 12. The plate 12 is typically less than 10,000 mm². A plurality of openings 16 are stamped in the walls 14A–D. The openings 16 are in rows and columns in a respective wall 14A–D.

Figure 2:
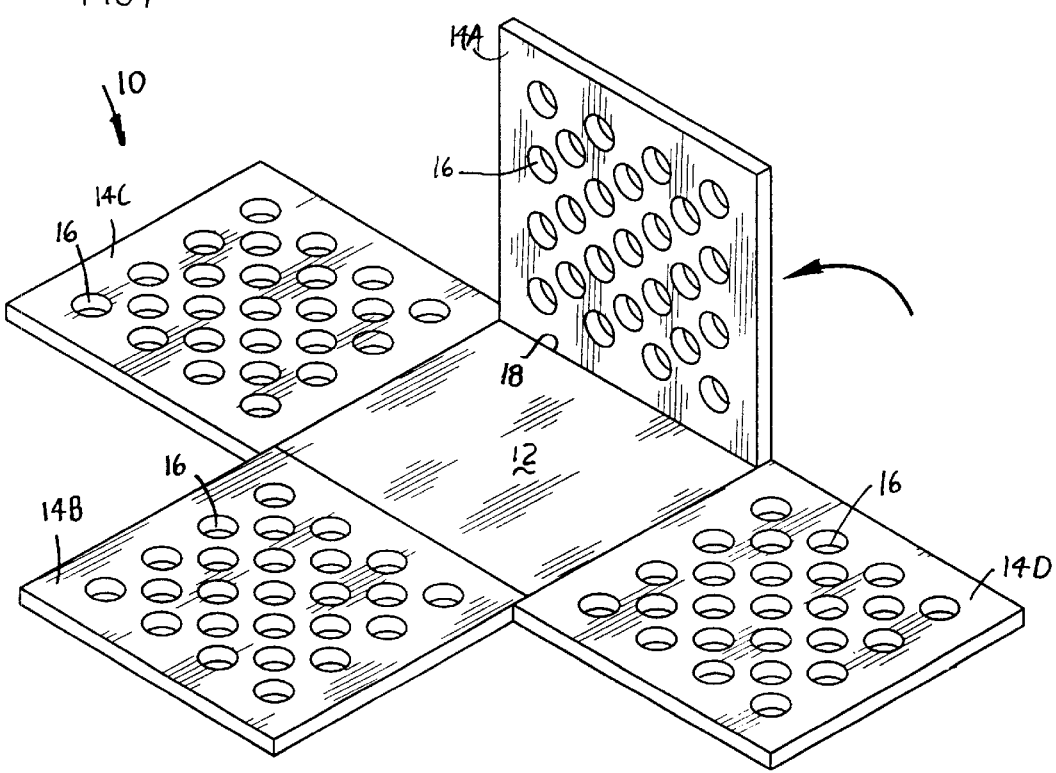
FIG. 2 is a view similar to FIG. 1 after one wall is bent out of a horizontal plane into a vertical plane.

FIG. 2 illustrates the metal sheet 10 after the wall 18A is bent up along a bend line 18 of a periphery of the plate 12. The wall 14A thereby extends vertically upwardly from an edge of the plate 12. The openings 16 are located over the entire wall 14A, i.e. in a lower half and in an upper half, from left to right and some of the openings are located directly above one another.

Figure 3:
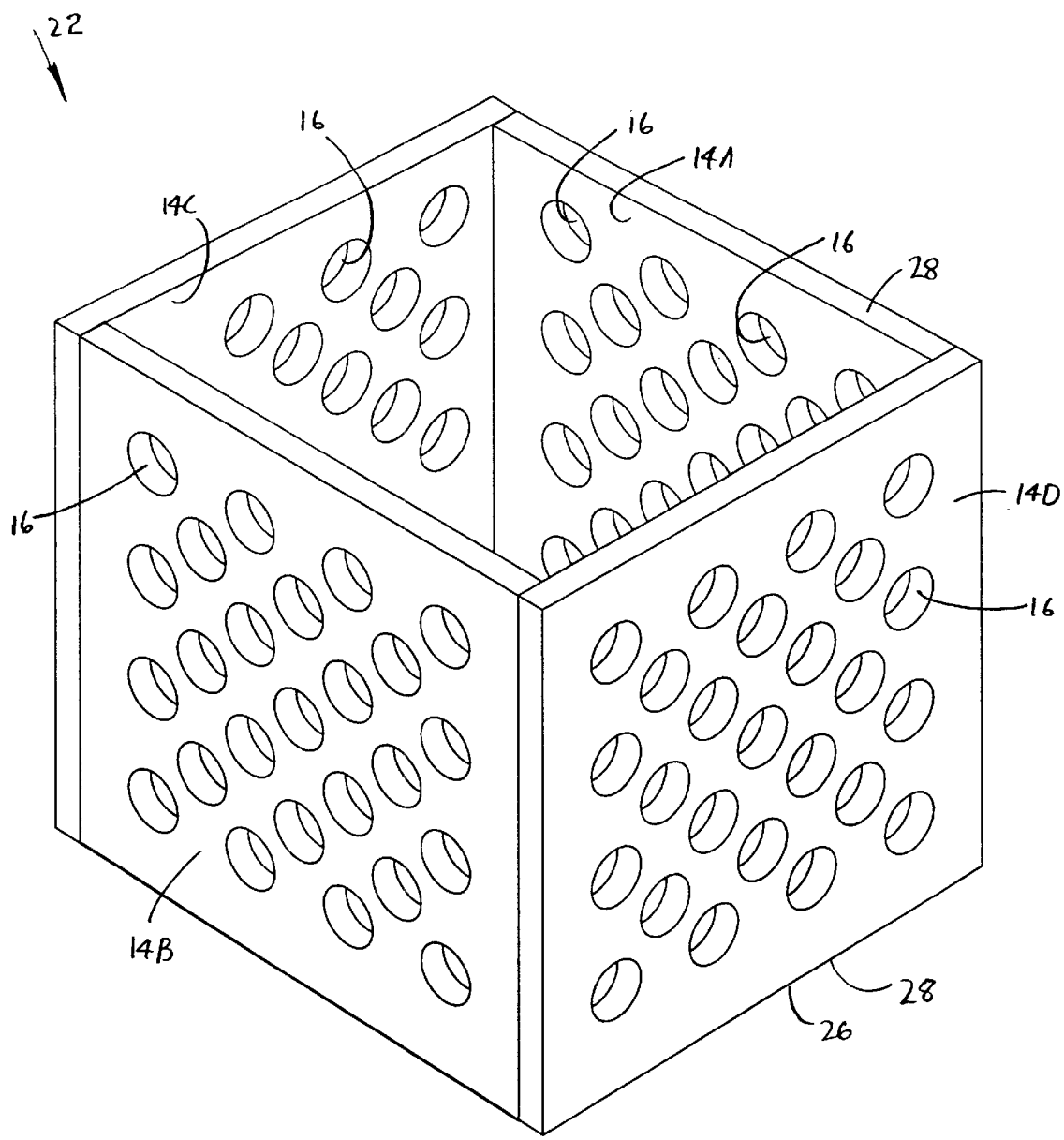
FIG. 3 is a perspective view of a heat sink which is constructed by bending other ones of walls of the metal sheet into vertical planes.

FIG. 3 illustrates a heat sink 22 which is manufactured by folding all of the walls 14B–D in a manner similar to the wall 14A. Each one of the walls, for example the wall 14B, has a respective edge contacting a respective edge of another wall, for example the wall 14D. The walls 14B and 14D are unattached to one another. The walls 14A and 14B are located between the walls 14C and 14D. All the walls 14A–D are thermally and structurally secured to the plate 12 and extend upwardly from the plate 12. The walls 14A–D form a wall structure which, when viewed from above in a direction 24, defines a square enclosure 25. The wall structure entirely surrounds the enclosure 25. The wall structure defined by the walls 14A–D has lower and upper ends 26 and 28. An entire periphery of the lower end 26 is thermally and structurally secured to the plate 12. The only communication into or out of the enclosure 25 is through the openings 16 and a month at the upper end 28.

Figure 4:
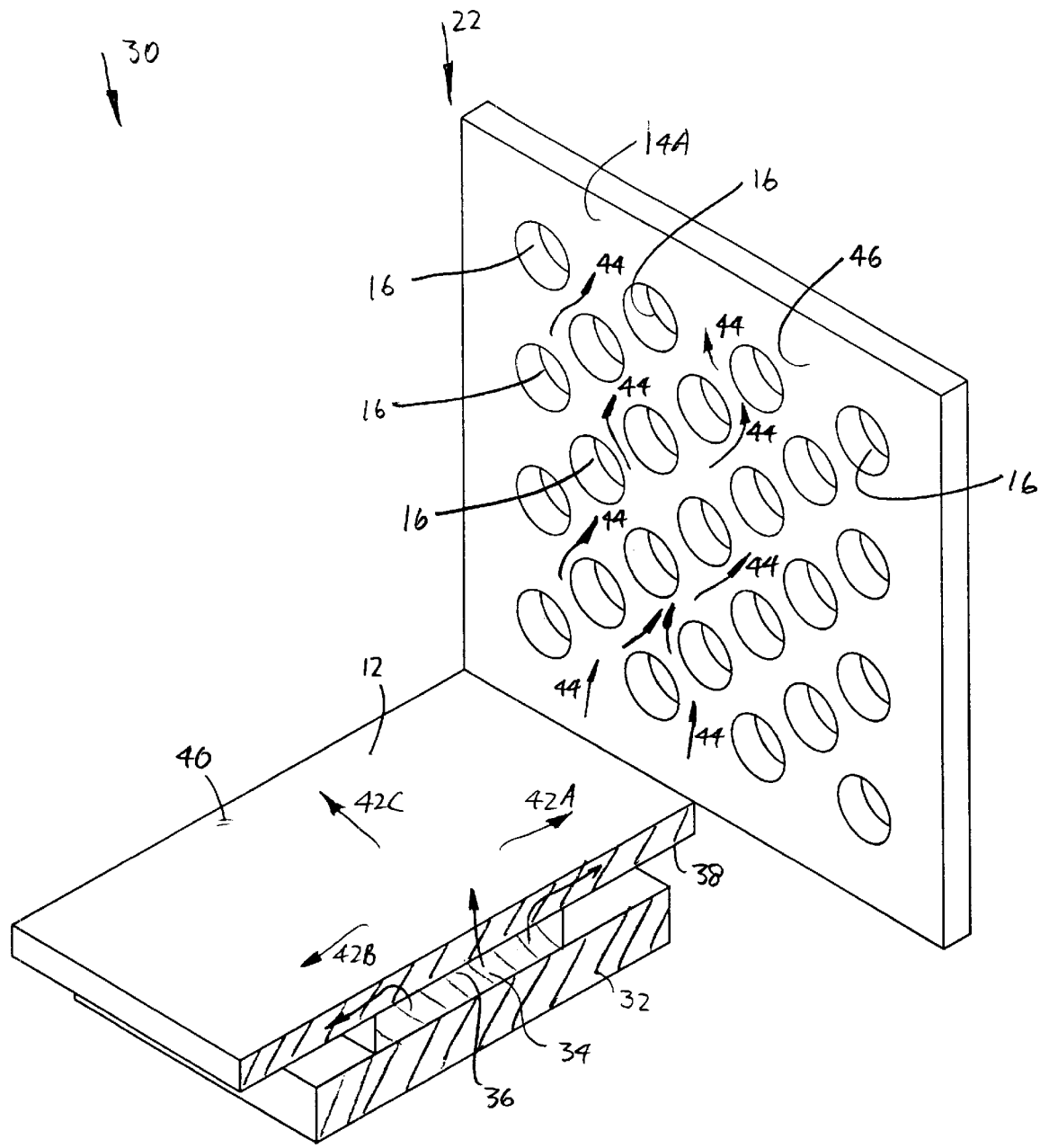
FIG. 4 is a partially cross-sectioned perspective view of components of a computer assembly including the heat sink to illustrate flow of heat through the heat sink.

FIG. 4 illustrates in cross-sectional view a portion of a computer assembly 30 including respective portions of a circuit board 32, an electronic component 34, and the heat sink 22. The portions of the heat sink 22 that are shown are a portion of the plate 12 and the wall 14A.

The electronic component 34 is typically a low-power electronic component such as a chipset which generates less than 10 and 20 W of heat when operated. The electronic component 34 is mounted to the board 32 and has an upper surface 36 located in a horizontal plane. A lower surface 48 of the heat plate 12 is located on top of the upper surface 36. The plate 12 is mounted in such a horizontal position utilizing an epoxy, spring clips or the like.

In use, heat generated by the electronic component 34 conducts from the electronic component 34 upwardly through the lower surface 38 into the heat plate 12. An upper surface 40 of the heat plate 12 is thereby heated.

The heat spreads in directions 42A–C horizontally to the walls 14A–D. The heat then conducts up the walls 14A–D. For example, the heat conducts first in the horizontal direction 42A in the heat plate 12 and then upwardly in directions 44 through lands between the openings 16 to an upper portion 46 of the wall 14A. The heat conducts in a similar manner through other ones of the walls 14B–D. The upper portion 46 of each wall 14A–D is thus heated.

Figure 5:
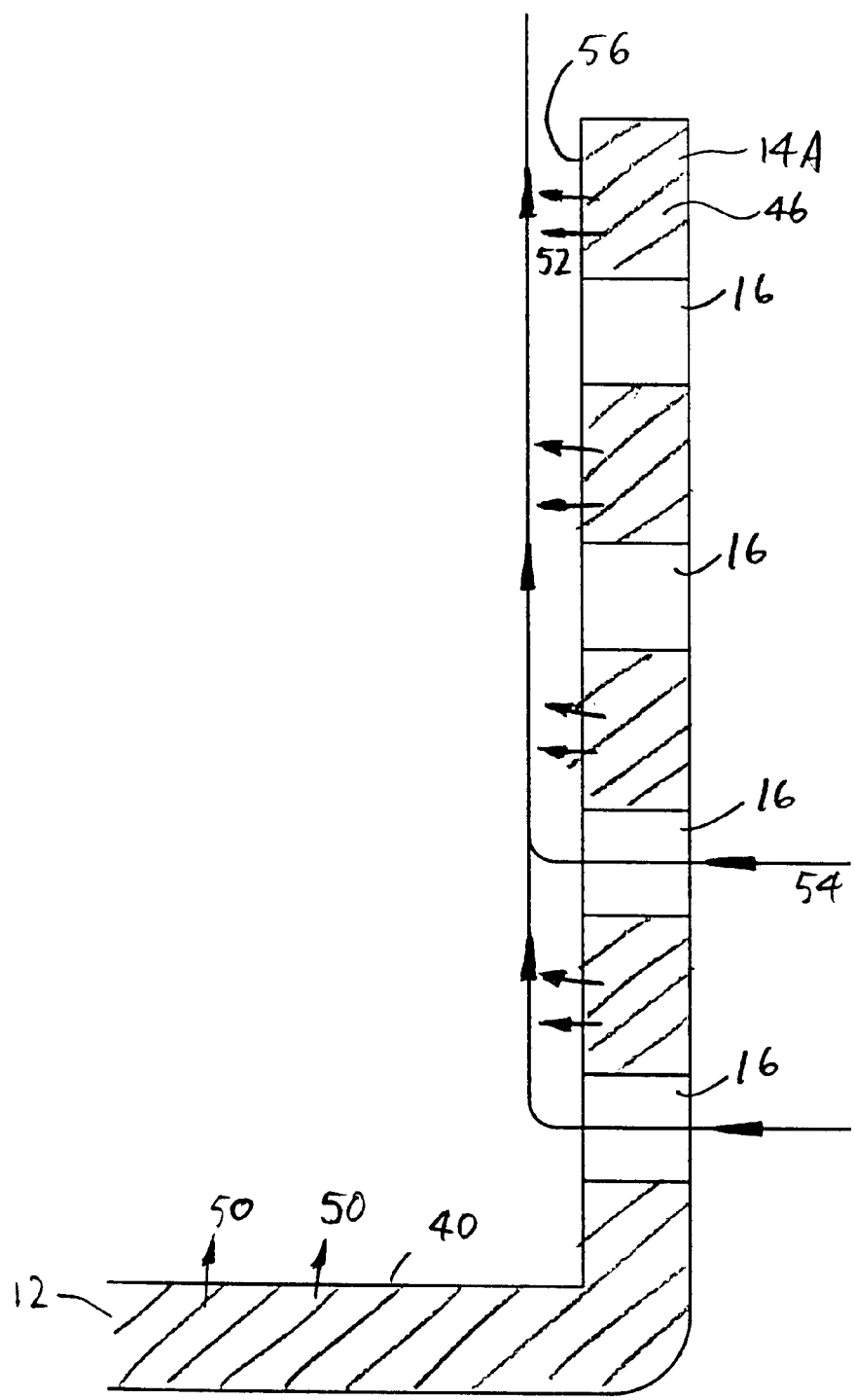
FIG. 5 is a cross-sectional side view of components of the heat sink to illustrate transfer of heat from the heat sink to air flowing through the heat sink.

FIG. 5 illustrates a portion of the plates 12 and the wall 14A. Heat is convected in a direction 50 from the upper surface 40 of the plate 12 to air above the upper surface 40. The air rises, thereby creating a vacuum in an area slightly above the surface 40 because it is entirely surrounded by the walls 14A–D. Because of the vacuum, air is drawn in from externally of the heat sink through lower ones of the openings 16 in the wall 14A. Heat is also convected in a direction 52 from the upper portion 46 to air located next to the upper portion 36. A natural convection path is thereby created wherein air is drawn in a horizontal direction 54 through lower ones of the openings 16 into the enclosure 25, and then flows upwardly over an inner surface 56 of the upper portion 46, where the heat is transferred thereto to continue flow of air. Air flows in a similar manner through and over the other ones of the walls 14B–D. All the air then exits through the mouth at the upper end 28 out of the enclosure 25.

It has been found that the heat sink 22 provides efficient cooling of low-power electronic components such as chipsets that generate between 10 and 20 W. No fan is required because the heat sink 22 can relatively efficiently remove heat utilizing natural convection. For enhanced thermal displation, a fan may be provided which may be located in or on the mouth at upper end 28.

It can thus be seen that a lightweight heat sink 22 is provided which is relatively inexpensive to manufacture, while still providing adequate transfer of heat.

The computer assembly further includes a housing and other components. The other components may include cards, electronic connections, disk drives, buses etc., all of which are mounted within the enclosure together with the components shown in FIGS. 1 to 4. The computer assembly may be a desktop computer having a housing defining an internal volume of between 10,000 and 20,000 cm$^2$, or be a larger server computer.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A heat sink for cooling an electronic component of a computer, comprising:
   a substanlially horizontal thermally conductive plate having a lower surface positionable on the electronic component so that heat is transferred from the electronic component to the plate; and
   a thermally conductive wall structure which defines a surrounding enclosure when viewed from above, and extends substantial vertically from a lower end to an upper end thereof, a periphery of the lower end being secured to the plate so that the heat can conduct from the plate through a lower portion of the wall structure to successive upper portions of the wall structure, a plurality of openings being defined at different elevations by the wall structure below respective ones of the upper portion through which air can enter at different elevations into the enclosure, flow upwardly over an inner surface of the wall structure next to the respective upper portions so that the heat is convected thereto, and exit through the upper end out of the enclosure.

2. The heat sink of claim 1 wherein the openings are on opposing sides of the enclosure.

3. The heat sink of claim 1 wherein one of the openings is located directly above another one of the openings.

4. The heat sink of claim 1 wherein the lower surface is less than 10,000 mm$^2$.

5. The heat sink of claim 1 wherein the enclosure has a rectangular shape when viewed from above.

6. The heat sink of claim 5 wherein the shape is square.

7. The heat sink of claim 1 wherein the plate and wall structure are formed from a metal sheet having a plurality of bends.

8. The heat sink of claim 7 wherein the plate is in a center of the sheet and a respective wall of the wall structure is on a respective edge of the plate with a respective bend between each wall and the plate.

9. The heat sink of claim 8 wherein adjacent edges of the walls are unattached to one another.

10. The heat sink of claim 8 wherein one of the walls is located between two of the walls opposing one another.

11. A heat sink for cooling an electronic component of a computer, comprising:
    a metal sheet having a horizontal plate and a plurality of walls attached to respective edges of the plate, the walls being bent out of a plane of the plate so as to extend upwardly from the plate and jointly define a surrounding enclosure when viewed from above, at least one opening being formed through at least one of the walls, so as to be entirely surrounded by the wall, into the enclosure through which air can enter into the enclosure, flow upwardly over an inner surface of the wall and exit the enclosure through an upper end thereof.

12. The heat sink of claim 11 wherein a respective opening is formed in each wall.

13. The heat sink of claim 11 wherein a plurality of openings are formed in the wall.

14. A computer assembly comprising:
    an electronic component which generates heat when being operated; and
    a heat sink comprising a thermally conductive plate in a plane and having a surface positioned on the electronic component so that the heat is transferred from the electronic component to the plate, and a thermally conductive wall structure which defines a surrounding enclosure when viewed normal to the plane of the plate, and extends substantial normal to the plane from a first end to an opposing second end thereof, a periphery of the first end being secured to the plate so that the heat can conduct from the plate through a first portion of the wall structure close to the plate to successive upper portions of the wall structure distant from the plate, a plurality of openings being defined at different elevations by the wall structure between one of the portions and the plate and between respective ones of the upper portions, through which air can enter into the enclosure, and exit through the second end out of the enclosure.

15. The computer assembly of claim 14 wherein the openings are on opposing sides of the enclosure.

16. A computer assembly comprising:
    an electronic component which generates heat when being operated; and
    a heat sink comprising a metal sheet having a horizontal plate on the electronic component and a plurality of walls attached to respective edges of the plate, the walls being bent out of a plane of the plate so as to extend upwardly from the plate and jointly define a surrounding enclosure when viewed from above, at least one opening being formed through at least one of the walls, so as to be entirely surrounded by the wall, into the enclosure through which air can enter into the enclosure, flow upwardly over an inner surface of the wall and exit the enclosure through an upper end thereof.

17. The computer assembly of claim 16 wherein a respective opening is formed in each wall.

18. The computer assembly of claim 16 wherein a plurality of openings are formed in the wall.

19. The heat sink of claim 1 wherein one of the openings has an upper edge which is no more than halfway below the upper end of the wall structure.

20. The heat sink of claim 1 wherein an outlet of the upper end has at least the same cross-sectional area as a cross-sectional area of the enclosure at the opening.

21. The heat sink of claim 1 wherein the openings have center points in vertically spaced rows.

22. The heat sink of claim 19 wherein the opening has an upper edge which is no more than halfway below the upper end of the wall structure.

* * * * *